United States Patent
Kurishita et al.

(10) Patent No.: US 9,872,346 B2
(45) Date of Patent: Jan. 16, 2018

(54) PHASE CONTROLLER APPARATUS AND METHODS

(71) Applicant: Cypress Semiconductor Corporation, San Jose, CA (US)

(72) Inventors: Takuya Kurishita, San Jose, CA (US); Yukisato Miyazaki, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/865,722

(22) Filed: Sep. 25, 2015

(65) Prior Publication Data

US 2016/0338157 A1    Nov. 17, 2016

Related U.S. Application Data

(60) Provisional application No. 62/162,483, filed on May 15, 2015.

(51) Int. Cl.
*H05B 33/08*    (2006.01)
*H03H 11/22*    (2006.01)

(52) U.S. Cl.
CPC ......... *H05B 33/0815* (2013.01); *H03H 11/22* (2013.01); *H05B 33/0818* (2013.01); *H05B 33/0845* (2013.01); *Y02B 20/346* (2013.01)

(58) Field of Classification Search
None
See application file for complete search history.

(56) References Cited

U.S. PATENT DOCUMENTS

| | | | | |
|---|---|---|---|---|
| 6,469,453 B2* | 10/2002 | Tajika | ................ | H05B 41/2824 315/197 |
| 6,493,653 B1* | 12/2002 | Drinkard | .............. | G01R 13/345 327/261 |
| 7,327,181 B2* | 2/2008 | Hussein | ............ | H02M 7/53875 327/296 |
| 7,466,176 B2* | 12/2008 | Huard | ................... | H02M 3/157 327/170 |
| 7,843,242 B1* | 11/2010 | Zhao | ....................... | G06F 1/025 327/172 |
| 8,134,253 B2* | 3/2012 | Watanabe | .......... | H05B 33/0815 307/37 |

(Continued)

OTHER PUBLICATIONS

International Search Report for International Application No. PCT/US16/16220 dated Mar. 11, 2016; 5 pages.

(Continued)

*Primary Examiner* — Alexander H Taningco
*Assistant Examiner* — Nelson Correa (57) ABSTRACT

A phase controller includes a plurality of pulse width modulation (PWM) circuits, a plurality of switching devices, a computing unit, and a latency generator. The plurality of PWM circuits output pulse signals. The plurality of switching devices are coupled to the respective plurality of PWM circuits, and switch on and off based on the pulse signals. The computing unit calculates the pulse signals to be output from the plurality of PWM circuits, based on outputs of the plurality of switching devices. The latency generator generates latency in any of the pulse signals so that edge positions of the pulse signals output from the plurality of PWM circuits do not collide with each other, wherein the pulse signals change values at the edge positions.

17 Claims, 9 Drawing Sheets

(56) References Cited

U.S. PATENT DOCUMENTS

| | | | | |
|---|---|---|---|---|
| 8,477,054 B2* | 7/2013 | Scheytt | ............... | H03K 7/08 |
| | | | | 341/143 |
| 9,013,116 B2* | 4/2015 | Porter | ............... | G01J 3/10 |
| | | | | 315/294 |
| 9,125,276 B2* | 9/2015 | Lee | ............... | G09G 3/3406 |
| 2012/0127210 A1* | 5/2012 | Huang | ............... | H05B 33/0815 |
| | | | | 345/690 |

OTHER PUBLICATIONS

Written Opinion of the International Searching Authority for International Application No. PCT/US16/16220 dated Mar. 11, 2016; 5 pages.

* cited by examiner

PHASE CONTROLLER APPARATUS AND METHODS

RELATED APPLICATIONS

This application claims the benefit of U.S. Provisional Application No. 61/162,483, filed May 15, 2015, all of which is incorporated by reference herein in its entirety.

TECHNICAL FIELD

The subject matter relates to the field of signal control. More specifically, but not by way of limitation, the subject matter discloses techniques for phase controller operation.

BACKGROUND

A phase controller may control current flowing through a switching device that is switched on and off according to a pulse signal output from a pulse width modulation (PWM) circuit. In the case where the outputs of PWM circuits of a plurality of channels are controlled with the same power supply in such a phase controller, if the pulse signals output from the respective PWM circuits change simultaneously, switching may noise occur, and cause a disturbance in waveform or a large fluctuation in power supply.

One technique to avoid switching noise is to prevent the pulse signals of the respective channels from changing simultaneously (colliding). A conceivable method for avoiding such edge collision of pulse signals is to add a fixed phase difference between the signals of the respective channels. However, in the case of feedback-controlling each PWM circuit, the pulse width from an on edge to an off edge changes dynamically. Accordingly, even when the fixed phase difference is provided between the channels to avoid a collision between on edges, it is difficult to avoid a collision between an on edge and an off edge and a collision between off edges. Particularly in the case where the pulse width is updated in a short unit such as several hundred Hz or less, collision avoidance computation needs to be performed in a time shorter than the unit.

BRIEF DESCRIPTION OF THE DRAWINGS

The accompanying drawings are incorporated herein and form a part of the specification.

In the drawings, like reference numbers generally indicate identical or similar elements. Additionally, generally, the left-most digit(s) of a reference number identifies the drawing in which the reference number first appears.

DETAILED DESCRIPTION

Embodiment described herein relate to phase controller apparatus and methods that can suppress collisions between pulse signals output from PWM circuits on a plurality of channels with reduced computational complexity.

An embodiment of a phase controller includes: a plurality of pulse width modulation (PWM) circuits configured to output pulse signals; a plurality of switching devices, respectively coupled to the plurality of PWM circuits, configured to switch on and off based on the pulse signals; a computing unit configured to calculate the pulse signals to be output from the plurality of PWM circuits, based on outputs of the plurality of switching devices; and a latency generator configured to generate latency in any of the pulse signals so that edge positions of the pulse signals output from the plurality of PWM circuits do not collide with each other, wherein the pulse signals change values at the edge positions. An embodiment of a phase control method, performed by a phase controller, includes: outputting a plurality of pulse signals; switching on and off based on the plurality of pulse signals; calculating the pulse signals to be output, based on signals of the switching; and generating latency in any of the pulse signals so that edge positions of the pulse signals do not collide with each other, wherein the pulse signals change values at the edge positions. These and further embodiments are described in more detail below with respect to the Figures.

In the following detailed description, reference is made to the accompanying drawings, which form a part hereof. In the drawings, similar symbols typically identify similar components, unless context dictates otherwise. Further, the drawings are intended to be explanatory and may not be drawn to scale. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

In other words, the following embodiments are illustrated for describing claimed subject matter, and the claimed subject matter is not limited to the embodiments. Furthermore, the claimed subject matter can be modified in various ways insofar as they do not deviate from the scope of the invention. Moreover, a positional relation such as up, down, left and right may be based on the positional relation as is illustrated in the drawings, unless otherwise specifically indicated. A dimensional ratio in the drawings is not limited to the shown ratio.

Example embodiment relate to a phase controller for controlling current flowing through a switching device that is switched on and off according to a pulse signal output from a pulse width modulation (PWM) circuit.

Figure 1:
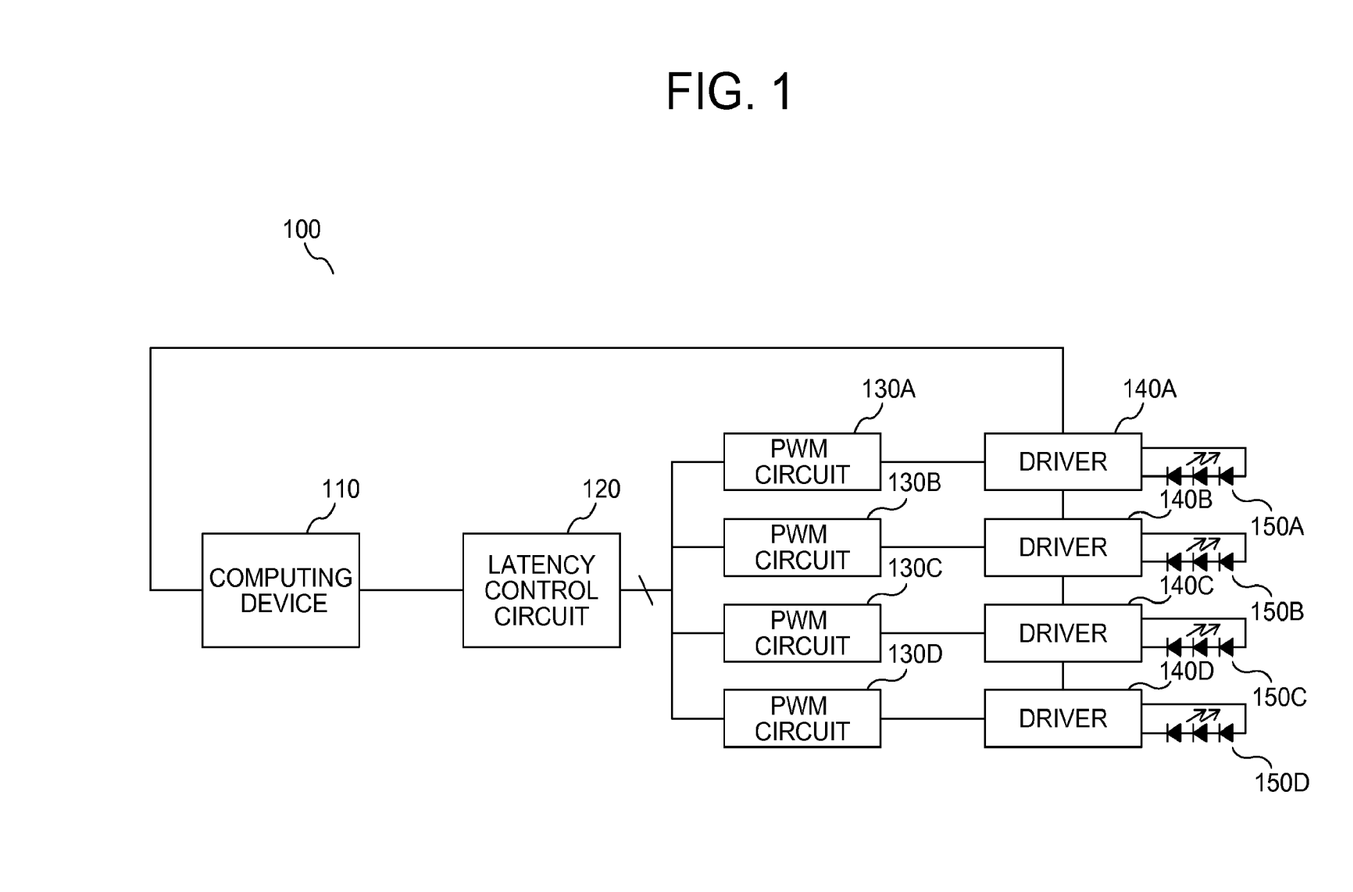
FIG. 1 is a block diagram showing structure of a phase controller according to an example embodiment.

FIG. 1 is a block diagram showing structure of a phase controller 100 according to an example embodiment. The phase controller 100 includes a computing device 110, a latency control circuit 120, PWM circuits 130A to 130D (hereafter also collectively referred to as "PWM circuits 130"), drivers 140A to 140D (hereafter also collectively referred to as "drivers 140"), and light emitting diodes (LEDs) 150A to 150D (hereafter also collectively referred to as "LEDs 150"). The phase controller 100 in FIG. 1 controls constant current flowing through each LED 150, thus enabling modulation (e.g., control) of light emitted from the LED 150. In other words, the phase controller 100 may be used as part of a light modulation system. Although the number of PWM circuits 130, the number of drivers 140, and the number of LEDs 150 are each 4 in the example in FIG. 1, this is not a limitation, and the number may be 3 or less or 5 or more as long as it is more than 1. The components controlled by the phase controller 100 are not limited to the LEDs 150, and may be any components that operate through switching control.

Each PWM circuit 130 outputs a pulse signal that changes state between a high level and a low level in a cycle. The pulse signal changes its state at edge positions. In the embodiments described herein, the rising edge of the pulse signal output from each PWM circuit 130 is the on edge and the falling edge of the pulse signal is the off edge, however, this is not a limitation, and in other embodiments, the rising edge may be the off edge and the falling edge the on edge.

The computing device 110 may calculate the duty ratio of the pulse signal to be output from each of the PWM circuits 130A to 130D, and outputs PWM duty information for generating a pulse signal according to the duty ratio. The duty ratio corresponds to the proportion of time during which the pulse signal is high level in 1 period. Here, the computing device 110 receives the output from the driver 140 as input, and calculates the target duty ratio. In other words, the computing device 110 calculates the duty ratio of the PWM circuit 130 by feedback control. As a result, for example, the PWM duty information output from the computing device 110 is dynamically updated at a constant frequency. The computing device 110 may be implemented by a special-purpose computing device, or by a microprocessor.

The latency control circuit 120 (e.g., a latency generator) may provide latency for at least one of the pulse signals output from the PWM circuits 130 so that edge positions of the pulse signals from the PWM circuits 130 do not collide with each other. In other words, the latency control circuit 120 may change at least one of the pulse signals, such that no more than one pulse signal of the pulse signals from the PWM circuits 130 changes state in the same clock cycle. The latency control circuit 120 may substantially maintain the duty ratio of the at least one pulse signal. The latency control circuit 120 calculates latency necessary to avoid collisions between the on edges (rising edges) and off edges (falling edges) of the pulse signals output from the respective PWM circuits 130A to 130D based on the duty ratios of pulse signals, as calculated by the computing device 110, to be output from the PWM circuits 130. The latency control circuit 120 then outputs PWM duty latency information to one or more of PWM circuits 130 to allow PWM circuits 130 to generate a pulse signal that takes the latency into consideration. An example of the detailed structure of the latency control circuit 120 will be described later, with reference to FIG. 4.

Each PWM circuit 130 outputs the pulse signal based on the PWM duty latency information output from the latency control circuit 120, to the corresponding driver 140. Each PWM circuit 130 outputs the pulse signal based on the dynamically updated PWM duty latency information. In an embodiment, the PWM circuits 130A to 130D and/or the drivers 140A to 140D are powered by the same power supply.

Each driver 140 is respectively coupled to each PWM circuit of the PWM circuits 130. Each driver 140 is a switching device that is switched on and off according to the pulse signal output from the corresponding PWM circuit 130, and supplies constant current to the corresponding LED 150. As mentioned above, the drivers 140A to 140D may operate with the same power supply. Light emitted from each LED 150 is adjusted based on the constant current output from the driver 140. Each driver 140 also outputs to the computing device, a the signal based on the current value output to the LED 150.

The phase controller 100 is a device for feedback-controlling the constant currents provided by the switching devices, which are switched on and off according to the pulse signals output from the PWM circuits 130. In embodiments, the output signals from the PWM circuits 130 and/or drivers 140 of the respective channels are coupled with the same power supply in a phase controller. If the pulse signals output from the PWM circuits 130 change simultaneously, switching noise may occur, and cause a disturbance in pulse signal waveform or a large fluctuation in power supply signal.

Figure 2:
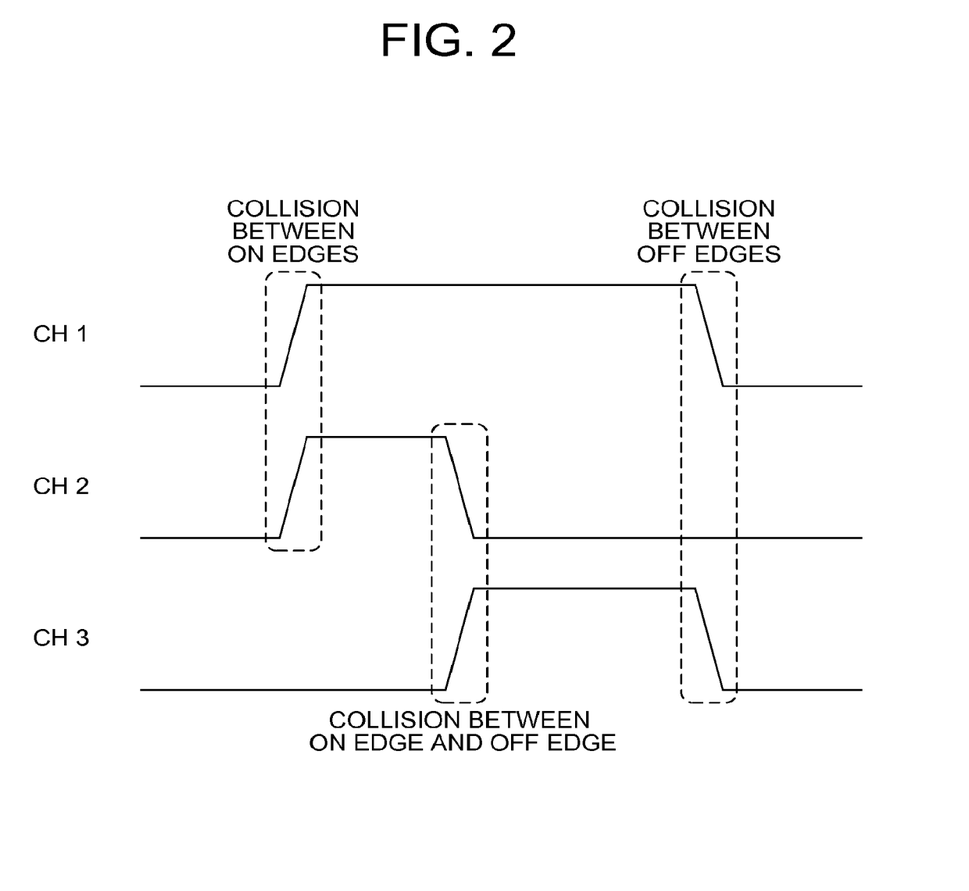
FIG. 2 is a chart diagram for describing edge collisions of pulse signals.

Collisions of pulse signals are described below with reference to FIG. 2. FIG. 2 shows pulse signals of three channels as an example. The on edge of the pulse signal of channel 1 collides with the on edge of channel 2. The off edge of channel 1 collides with the off edge of channel 3. The off edge of channel 2 collides with the on edge of channel 3. Such edge collisions between channels can cause switching noise irrespective of whether the edges are on or off edges, and so it is preferable to suppress edge collisions.

One technique for avoiding such edge collision between channels is to provide a fixed phase difference between the channels (e.g., where there is a fixed difference between the phase of one pulse signal and the phase of another pulse signal). However, in the case of performing feedback control, the duty ratio of the pulse signal changes dynamically, i.e. the time from the on edge to the off edge changes dynamically. It is therefore difficult to avoid collisions between an on edge and an off edge and between off edges, with the technique of providing the fixed phase difference between the channels.

In view of this, the phase controller 100 according to an embodiment can dynamically change phase differences between the channels so that no edge collision occurs between the channels.

In an embodiment, dynamically providing the phase difference between the channels involves dynamically generating latency in part of the channels and causing duty ratio changes. This is described below, with reference to FIG. 3.

Figure 3:
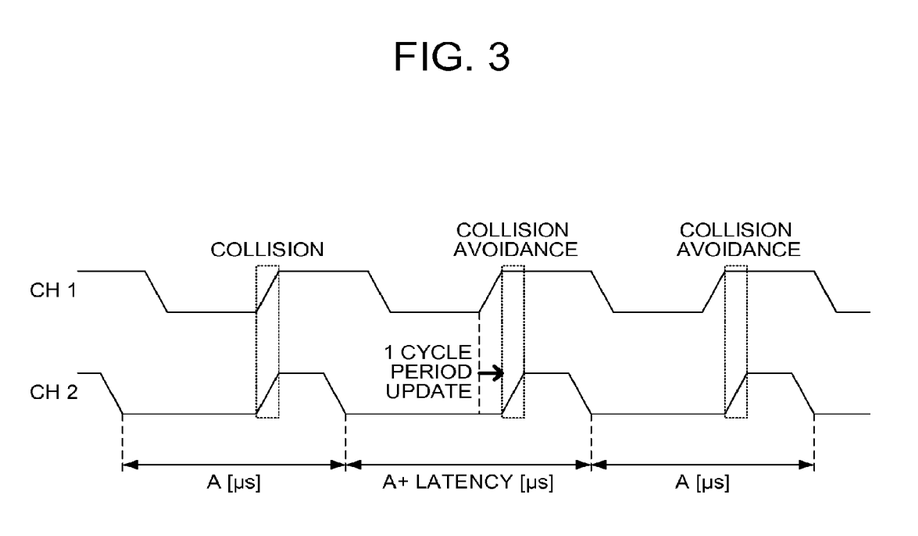
FIG. 3 is a chart diagram for describing a latency generation method according to an example embodiment.

FIG. 3 is a chart diagram for describing a latency generation method according to an example embodiment. FIG. 3 shows a latency of one cycle generated in the second period of channel 2, in order to avoid the collision. While the original length of the period of channel 2 is A μs, the addition of the latency in the second period results in the period being longer by the latency. Since the duration of low level in the second period of the pulse signal of channel 2 is longer, the duty ratio of channel 2 is lower.

As greater the latency required to avoid the edge collision, the greater the duty ratio is affected. Accordingly, in some embodiments, the phase controller 100 divides the target latency into a plurality of parts and adds or subtracts the plurality of parts over a plurality of periods, to reduce the influence of latency on the duty ratio.

In an embodiment, the phase controller 100 performs feedback control and the phase of each channel changes at each repetition frequency. Hence, in the case of adding latency to the pulse signal of each channel so that no edge collision occurs between channels, the computation of the latency to be generated needs to be completed within the duration of the repetition frequency. The calculation time required for such computation, however, significantly increases especially when the number of channels is increased.

In the following technique for phase collision avoidance, after the PWM circuits 130 output the pulse signals, the pulse signals are fed back to determine whether or not a collision occurs and, in the case where the collision occurs, the phases are adjusted. With such a technique, however, whether or not a collision occurs cannot be determined unless the pulse signals are output once, so it takes time to complete phase adjustment.

Accordingly, in an embodiment, the phase controller 100 determines collisions without pulse signal feedback. In this embodiment, the phase controller 100 first divides the period of each pulse signal into fixed sections, and generates a table in which each section, whether or not the section is an edge position of the pulse signal (whether or not the section is a time period during which a collision is to be avoided) is represented by 1 bit. The phase controller 100 then compares the table between channels and, if an edge position collision occurs, the phase controller 100 performs bit shift operation on one of the tables. Thus, instead of determining a collision by pulse signal feedback, the phase controller 100 virtually generates a table representing the pulse signal of each channel, and performs collision avoidance computation through comparison of the tables of the respective channels and bit shift operations. In this way, the phase controller 100 reduces the number of calculations and the calculation time necessary for its operation.

Figure 4:
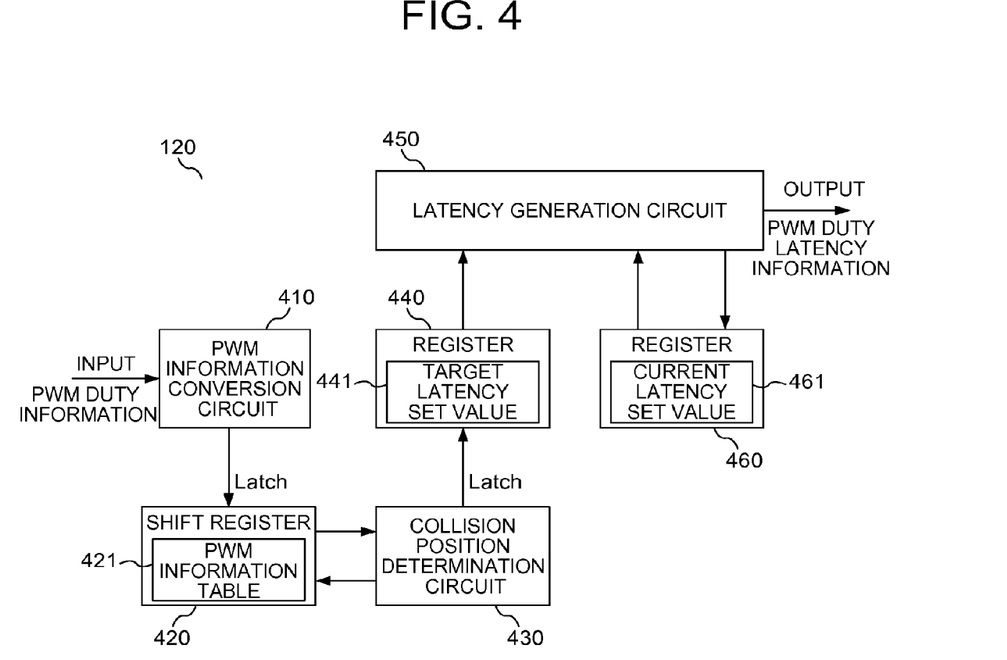
FIG. 4 is a block diagram showing structure of a latency control circuit according to an example embodiment.

FIG. 4 is a block diagram showing structure of a latency control circuit according to an example embodiment. The latency control circuit 120 includes a PWM information conversion circuit 410, a shift register 420, a collision position determination circuit 430, a register 440, a latency generation circuit 450, and a register 460. As mentioned earlier, the latency control circuit 120 performs operations such as bit comparison and bit shift operations, and can be implemented by hardware using logic circuitry and/or of firmware (software).

The PWM information conversion circuit 410 (e.g., table generator) generates, from PWM duty information relating to a pulse signal to be generated, a PWM information table 421 indicating, for each section of the pulse signal, whether or not the section is an edge occurrence area, i.e. a collision avoidance time period during which a collision is to be avoided, and stores the PWM information table 421 in the shift register 420.

The collision position determination circuit 430 (e.g., a latency calculator) determines whether or not an edge collision occurs using the PWM information table 421 generated for the pulse signal of each channel, and in the case where the edge collision occurs, requests the shift register 420 to perform a bit shift on the PWM information table 421. By repeatedly performing this process, the collision position determination circuit 430 calculates a target latency set value 441 to provide a phase that causes no collision. The target latency set value 441 is stored in the register 440.

The latency generation circuit 450 has a function of delaying the pulse signal generated by the PWM circuit 130 according to the target latency set value 441 stored in the register 440. Here, if the pulse signal is delayed by the target latency set value 441 all at once, the duty ratio significantly changes instantaneously. In an embodiment, the latency generation circuit 450 distributes portions of the target latency set value 441 across periods of the pulse signal. For example, the latency generation circuit 450 may perform a process of delaying by a minimum delayable unit (minimum resolution of latency adjustment width) in alternate periods of the pulse signal. Latency generated in each channel up to the present is stored in the register 460 as a current latency set value 461. By repeatedly performing this process until the current latency set value 461 of each channel matches the corresponding target latency set value 441, the latency generation circuit 450 can avoid edge collisions between the pulse signals of the respective channels.

The processes by the PWM information conversion circuit 410, collision position determination circuit 430, and latency generation circuit 450 are described in further detail below.

The PWM information conversion circuit 410 receives the PWM duty information from the computing device 110 as input, and converts the PWM duty information to the PWM information table 421. In an embodiment, the PWM information conversion circuit 410 divides the period of the pulse signal realized by the input PWM duty information into fixed sections, and determines, for each section, whether or not each section is a time period during which an edge occurs, i.e. a time period during which a collision is to be avoided, by comparison of 1 bit. The determination results constitute the PWM information table 421.

In an embodiment, the PWM information conversion circuit 410 generates as many PWM information tables 421 as there are PWM circuits 130. In the example in FIG. 1, the phase controller 100 includes four channels for PWM circuits 130, and the PWM information conversion circuit 410 generates the PWM information table 421 for each of the four channels. The PWM information conversion circuit 410 stores the generated PWM information tables 421 in the shift register 420.

Examples of generating the PWM information table 421 by the PWM information conversion circuit 410 are described below, with reference to FIGS. 5A, 5B, and 6. As mentioned above, the PWM information conversion circuit 410 sets each section where an on edge or off edge of the pulse signal occurs, as a collision avoidance time period. The following describes an example of generating the PWM information table 421 with respect to an on edge.

Figure 5A:
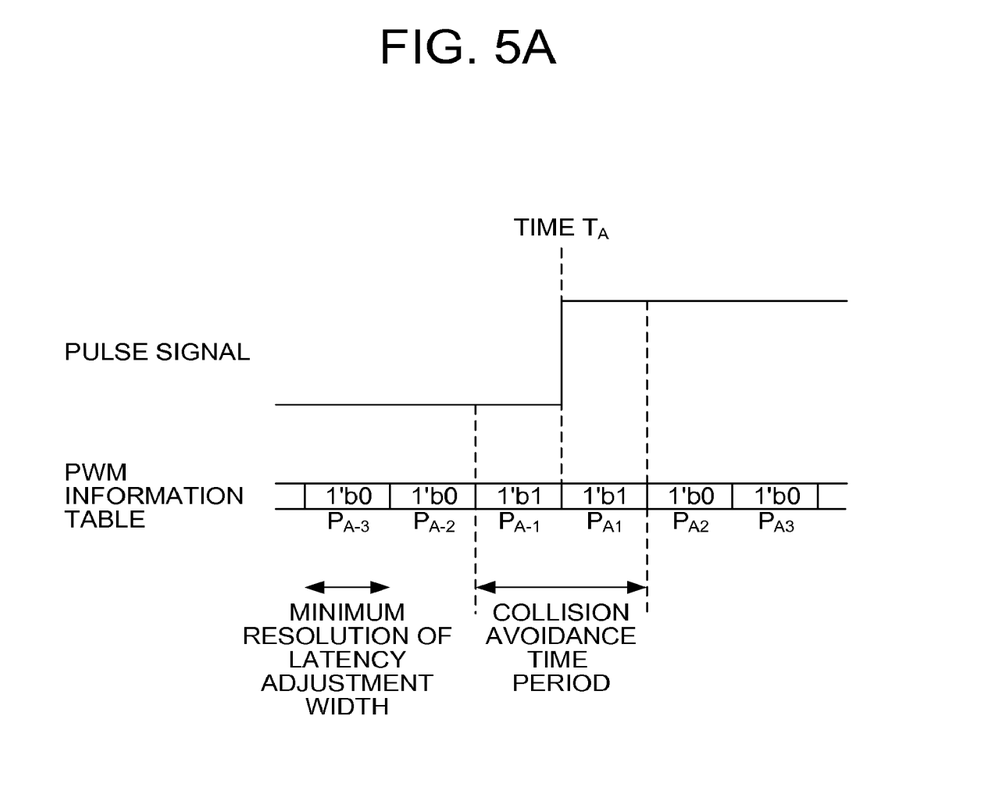
FIGS. 5A and 5B are chart diagrams showing PWM information table generation according to example embodiments.
Figure 5B:
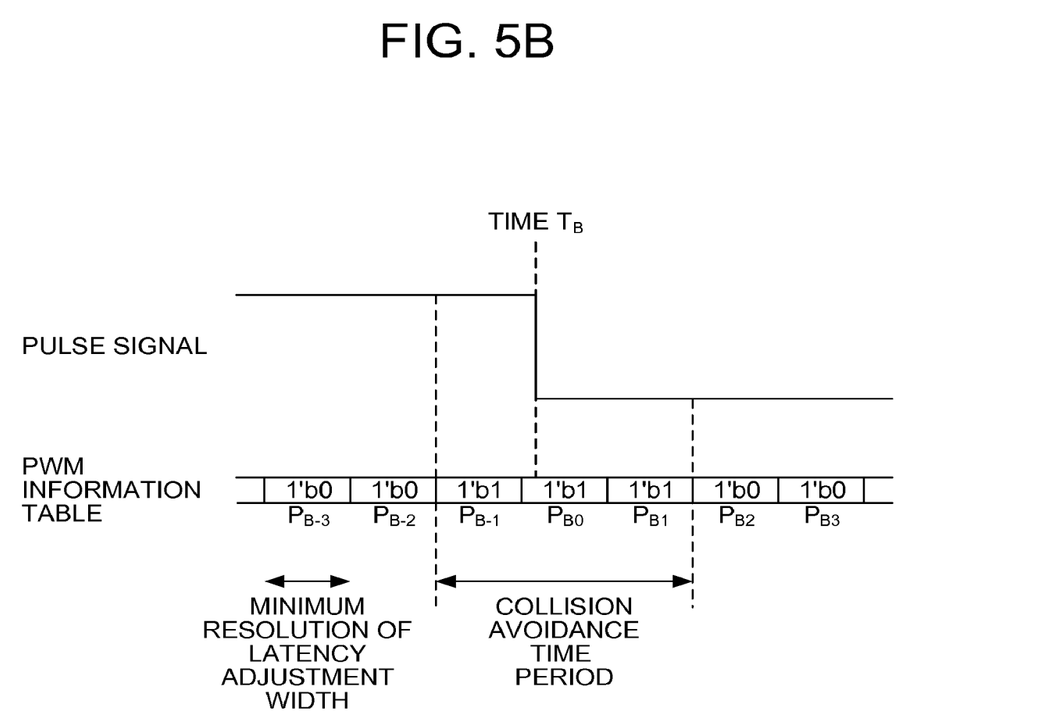

FIGS. 5A and 5B are chart diagrams showing PWM information table 421 generation according to example embodiments. The following describes generating the PWM information table 421 for the on edge, with reference to FIG. 5A The upper part of FIG. 5A shows the waveform of the pulse signal generated based on the input PWM duty information, and the lower part of FIG. 5A shows the corresponding PWM information table 421. The period of the pulse signal is divided by the time width of the latency adjustable minimum resolution. The resulting sections are $P_{A-3}$, $P_{A-2}$, $P_{A-1}$, $P_{A1}$, $P_{A2}$, and $P_{A3}$. The pulse signal transitions from low level to high level at time $T_A$ between section $P_{A-1}$ and section $P_{A1}$. In other words, the on edge is located at the boundary between section $P_{A-1}$ and section $P_{A1}$. This is because the sections are set with respect to the on edge.

In this example, the pulse signal is shown to change ideally, i.e. transitions from low level to high level instantaneously. In the case of an actually generated pulse signal a predetermined time is required to transition from low level to high level as shown in FIGS. 2 and 3. Since the pulse signal actually changes during a time period before and after time $T_A$, a change of a pulse signal of another channel in this time period could be used to avoid a collision.

In view of this, in the example in FIG. 5A, sections $P_{A-1}$ and $P_{A1}$ before and after time $T_A$ which is the on edge occurrence time are set as a collision avoidance time period. In the example in FIG. 5A, sections $P_{A-1}$ and $P_{A1}$ corresponding to the collision avoidance time period are assigned "1'b1" (hereafter also simply written as "1") and the other sections $P_{A-3}$, $P_{A-2}$ $P_{A2}$, and $P_{A3}$ are assigned "1'b0" (hereafter also simply written as "0") in the PWM information table 421. In this way, for each of sections $P_{A-3}$, $P_{A-2}$, $P_{A-1}$, $P_{A1}$, $P_{A2}$, and $P_{A3}$, whether or not the section is a time period during which a collision is to be avoided, i.e. a time period during which an on edge occurs, is represented by 1 bit.

The following describes generating the PWM information table 421 for the off edge, with reference to FIG. 5B. In the example in FIG. 5B as in FIG. 5A, the period of the pulse signal is divided by the time width of the latency adjustable minimum resolution. The resulting sections are $P_{B-3}$, $P_{B-2}$, $P_{B-1}$, $P_{B0}$, $P_{B1}$, $P_{B2}$, and $P_{B3}$. In FIG. 5B, the pulse signal transitions from high level to low level at time $T_B$ included during section $P_{B0}$. In embodiments where the sections are set with respect to the on edge as mentioned above, the on edge may be expected to be located at the section boundary. However, since the high level duration of the pulse signal varies dynamically, the position of the off edge may not be expected to be located at the section boundary as shown the example in FIG. 5B.

In this example, the pulse signal is shown to change ideally, i.e. transitions from high level to low level instantaneously. In the case of an actually generated the pulse signal a predetermined time is required for the transition as noted above. Since there is a high possibility that the pulse signal changes during a time period around time $T_B$, a change of a pulse signal of another channel in this time period could be used to avoid a collision.

In view of this, in the example in FIG. 5B, section $P_{B0}$ including time $T_B$ which is the off edge occurrence time and sections $P_{P-1}$ and $P_{B1}$ before and after section $P_{B0}$ are set as a collision avoidance time period. In the example in FIG. 5B, sections $P_{B-1}$, $P_{B0}$, and $P_{B1}$ corresponding to the collision avoidance time period are assigned "1'b1" and the other sections $P_{B-3}$, $P_{B-2}$, $P_{B2}$, and $P_{B3}$ are assigned "1'b0" in the PWM information table 421. In this way, for each of sections $P_{B-3}$, $P_{B-2}$, $P_{B-1}$, $P_{B0}$, $P_{B1}$, $P_{B2}$, and $P_{B3}$, whether or not the section is a time period during which a collision is to be avoided, i.e. a time period during which an off edge is expected to occur, is represented by 1 bit.

Figure 6:
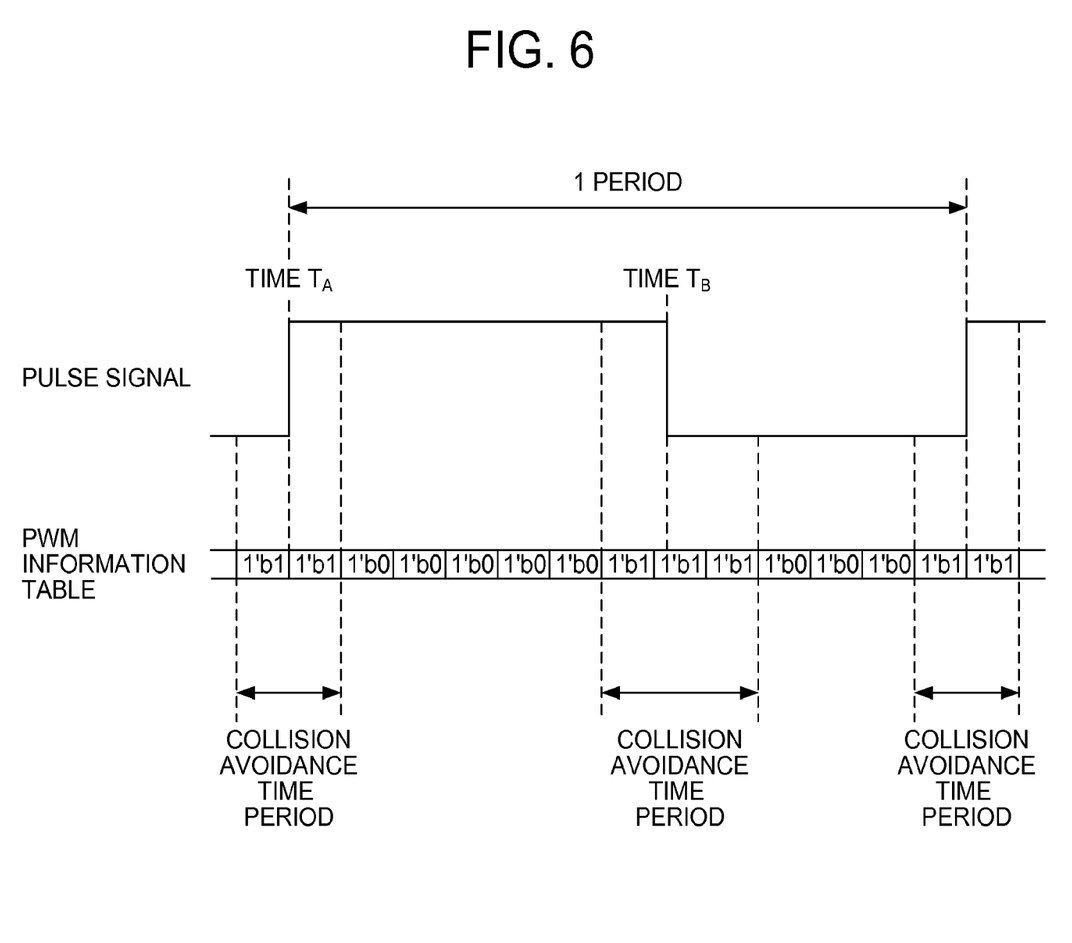
FIG. 6 is a chart diagram showing PWM information table generation according to an example embodiment.

FIG. 6 is a chart diagram showing PWM information table 421 generation according to an embodiment. As shown in FIG. 6, the two sections before and after time $T_A$ at which the on edge occurs and the three sections before and after time $T_B$ at which the off edge occurs are assigned "1'b1", and the other sections are assigned "1'b0", in the PWM information table 421. The sections assigned "1'b1" can thus be distinguished as the collision avoidance time period during which a collision is to be avoided. Although the above describes the case where the sections are set with respect to the on edge, this is not a limitation, and the sections may be set with respect to the off edge. For example, two sections before and after time $T_B$ at which the off edge occurs and three sections before and after time $T_A$ at which the on edge occurs may each be set as a collision avoidance time period. Although the above describes the case where the numbers of sections set as the collision avoidance time periods are 2 and 3, this is not a limitation. For example, in the case where the time required for each of rise and fall of the pulse signal is longer than the minimum resolution, the numbers of sections set as the collision avoidance time periods may be larger, e.g. 4 and 5. Moreover, the length of each section need not be the minimum resolution of the latency adjustment width, and may be a longer than the minimum resolution.

The collision position determination circuit 430 reads the PWM information table 421 of each channel stored in the shift register 420, and calculates latency so that the edge positions of the PWM signals of the respective channels do not collide with each other. The following describes a specific example of the process by the collision position determination circuit 430, with reference to FIG. 7.

Figure 7:
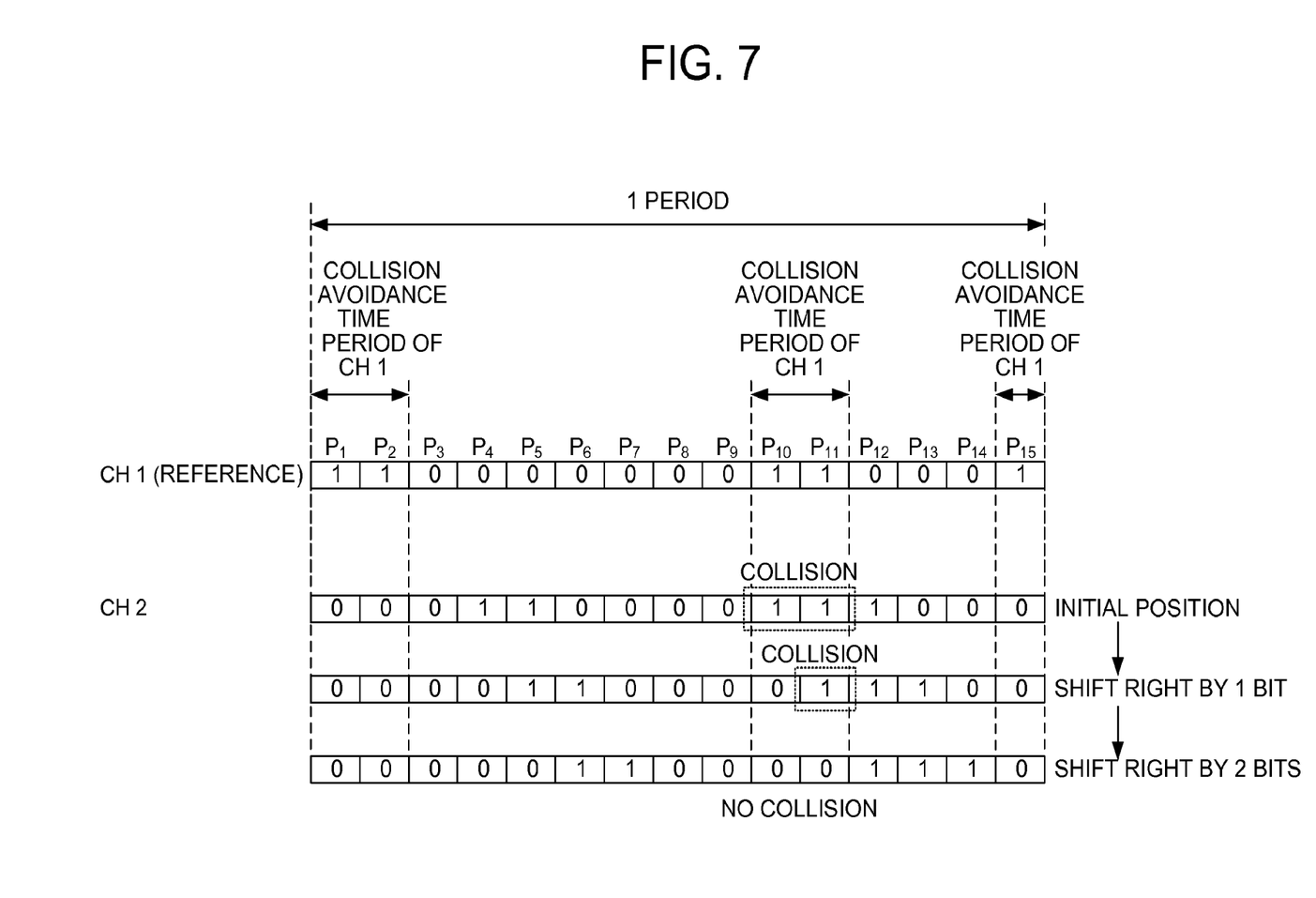
FIG. 7 is a chart diagram showing collision position determination according to an example embodiment.

FIG. 7 is a chart diagram showing collision position determination according to an example embodiment. In the example in FIG. 7, the PWM information table of each of channels 1 and 2 for 1 period is divided into sections $P_1$ to $P_{15}$. Sections $P_1$, $P_2$, $P_{10}$, $P_{11}$, and $P_{15}$ of channel 1 are collision avoidance time periods, and are assigned "1" in the PWM information table 421. Meanwhile, in the initial position of channel 2, sections $P_4$, $P_5$, $P_{10}$, $P_{11}$, and $P_{12}$ are collision avoidance time periods, and are assigned "1" in the PWM information table 421.

In an embodiment, the collision position determination circuit 430 compares the PWM information tables 421 of channels 1 and 2 on a section basis, and detects that both channels are "1" in sections $P_{10}$ and $P_{11}$. This means channels 1 and 2 with the current position collide with each other in the collision avoidance time periods. Suppose channel 2 is shifted with respect to channel 1. The collision position determination circuit 430 requests the shift register 420 to shift the PWM information table 421 of channel 2 right by 1 bit. As a result, sections $P_5$, $P_6$, $P_{11}$, $P_{12}$, and $P_{13}$ become "1", i.e. collision avoidance time periods, in the PWM information table 421 of channel 2. The collision position determination circuit 430 may then compare the PWM information tables 421 of channels 1 and 2 on a section basis, and detect that both channels are "1" in section $P_{11}$. This means channels 1 and 2 collide with each other in the collision avoidance time periods, even with the current phase (latency) of channel 2. The collision position determination circuit 430 may then request the shift register 420 to further shift the PWM information table 421 of channel 2 right by 1 bit (2 bits from the initial position). As a result, sections $P_6$, $P_7$, $P_{12}$, $P_{13}$, and $P_{14}$ become "1", i.e. collision avoidance time periods, in the PWM information table 421 of channel 2. The collision position determination circuit 430 then compares the PWM information tables 421 of channels 1 and 2 on a section basis, and detects that there is no section where both channels are "1". This means channels 1 and 2 do not collide with each other in the collision avoidance time periods, with the current phase of channel 2.

By performing such a process between the PWM information tables 421 of the respective channels, the collision position determination circuit 430 finds the phase (the phase (latency) of each of the other channels with respect to the reference channel) that causes no collision between any channels. To do so, the collision position determination circuit 430 performs bit comparison between the PWM information tables 421 of the respective channels, and determines whether or not the position of "1" overlaps. In the case where the position of "1" overlaps, the collision position determination circuit 430 shifts the PWM information table 421 of the channel other than the reference channel right by 1 bit. The collision position determination circuit 430 repeats this process until the value of "1" does not overlap between the channels. The total bit shift to the position where the value of "1" no longer overlaps is the latency for avoiding edge collisions.

Figure 8:
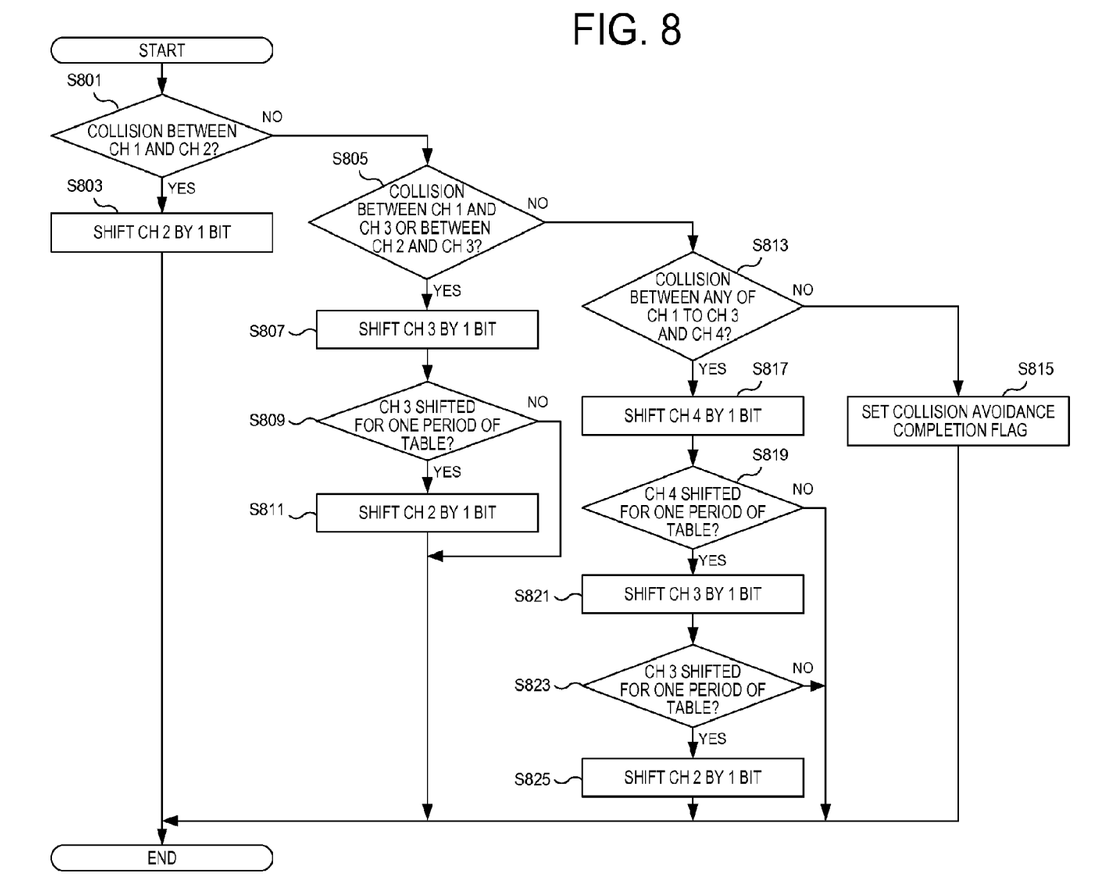
FIG. 8 is a flow diagram showing a method of edge collision avoidance according to an example embodiment.

FIG. 8 is a flow diagram showing a method of edge collision avoidance according to an example embodiment. In various embodiment all or a portion of the method may be performed by hardware, software or a combination of hardware and software. In an embodiment the method is performed by the collision position determination circuit 430. Edge collision avoidance involving four channels is shown in FIG. 8, where channel 1 is the reference channel for latency. The process flow in FIG. 8 is repeatedly performed until a collision avoidance completion flag is set in S815 described later.

First, the collision position determination circuit 430 determines whether or not an edge collision occurs between channels 1 and 2, by comparing their PWM information tables 421 (S801). In the case where the edge collision occurs (S801: YES), the collision position determination circuit 430 requests the shift register 420 to shift the PWM information table 421 of channel 2 right by 1 bit (S803).

In the case where no edge collision occurs between channels 1 and 2 (S801: NO), the collision position determination circuit 430 determines whether or not an edge collision occurs between channels 1 and 3 or between channels 2 and 3, by comparing their PWM information tables 421 (S805). In the case where the edge collision occurs (S805: YES), the collision position determination circuit 430 requests the shift register 420 to shift the PWM information table 421 of channel 3 right by 1 bit (S807). The collision position determination circuit 430 further determines whether or not the total amount of shift of channel 3 from the initial position has reached 1 period of the PWM information table 421 (S809). This is equivalent to determining whether or not collision determination has been completed for the whole 1 period of channel 3. In the case where the total amount of shift of channel 3 from the initial position has reached 1 period of the PWM information table 421 (S809: YES), the collision position determination circuit 430 requests the shift register 420 to shift the PWM information table 421 of channel 2 right by 1 bit (S811).

In the case where no edge collision occurs between channel 3 and any of channels 1 and 2 in S805 (S805: NO), the collision position determination circuit 430 determines whether or not an edge collision occurs between channel 4 and any of channels 1 to 3, by comparing their PWM information tables 421 (S813). In the case where no edge collision occurs (S813: NO), the collision position determination circuit 430 sets the collision avoidance completion flag. By this process, the collision position determination circuit 430 ends the process of calculating latency for avoiding edge collisions of all channels.

In the case where the edge collision occurs between the channels in S813 (S813: YES), the collision position determination circuit 430 requests the shift register 420 to shift the PWM information table 421 of channel 4 right by 1 bit (S817). The collision position determination circuit 430 further determines whether or not the total amount of shift of channel 4 from the initial position has reached 1 period of the PWM information table 421 (S819). In the case where the total amount of shift of channel 4 from the initial position has reached 1 period of the PWM information table 421 (S819: YES), the collision position determination circuit 430 requests the shift register 420 to shift the PWM information table 421 of channel 3 right by 1 bit (S821).

The collision position determination circuit 430 also determines whether or not the total amount of shift of channel 3 from the initial position has reached 1 period of the PWM information table 421 (S823). In the case where the total amount of shift of channel 3 from the initial position of the PWM information table 421 has reached 1 period of the PWM information table 421 (S823: YES), the collision position determination circuit 430 requests the shift register 420 to shift the PWM information table 421 of channel 2 right by 1 bit (S825).

As mentioned above, the process in FIG. 8 may be repeatedly performed until the collision avoidance completion flag is set in S815. The resulting position in the PWM information table 421 of each channel when the collision avoidance completion flag is set enables edge collision avoidance between the channels. The collision position determination circuit 430 stores the information of the latency of each channel which is the amount of shift from the initial position to the calculated collision avoidance position, in the register 440 as the target latency set value 441.

The following describes the process by the latency generation circuit 450. The latency generation circuit 450 has a function of delaying the PWM signal to be output from the PWM circuit 130, with reference to the target latency set value 441 stored in the register 440.

Consider the case where the latency generation circuit 450 adds the latency stored in the target latency set value 441 all at once. If the latency is generated all at once, the duty ratio of the pulse signal may change significantly, particularly in the case where the latency is large. To avoid this, the latency generation circuit 450 accordingly adds or subtracts the target latency set value 441 in divided form, in the pulse signal.

For example, the latency generation circuit 450 generates, out of the target latency set value 441 to be generated, latency of 1 cycle of the latency adjustable minimum resolution, by addition or subtraction. After generating the latency, the latency generation circuit 450 can store the current latency set value 461, indicating all latency generated up to the present, in the register 460. The latency generation circuit 450 may repeatedly perform this process of adding or subtracting divided latency in, for example, alternate periods until the target latency set value 441 and the current latency set value 461 match, thereby avoiding edge collisions. By dividing the target latency set value 441 to be generated and adjusting the latency by bits in this way, the latency generation circuit 450 can delay the pulse signal by bits to the target position where no edge collision occurs, without significantly changing the duty ratio.

As described above, the phase controller 100 can suppress edge collisions of any of on and off edges, in the pulse signals of the respective channels generated by the PWM circuits 130.

The phase controller 100 generates the PWM information table 421 in which, for each section, whether or not the section is a collision avoidance time period during which an edge collision is likely to occur is represented by 1 bit. The phase controller 100 may use the PWM information table 421 to calculate such latency of the pulse signal that can avoid edge collisions. In an embodiment, the latency control circuit 120 in the phase controller 100 can calculate the latency that can avoid edge collisions, by operation of repeatedly performing bit comparison and bit shift on the PWM information table 421. Compared to prior techniques, using the embodiment described herein, the number of process steps necessary to find the position for edge collision avoidance between the channels can be reduced. In addition, the latency control circuit 120 can be implemented by logic circuitry of hardware, which contributes to a smaller control integrated circuit (IC) for implementing the phase controller 100.

After calculating the latency that can avoid edge collisions between the channels, the phase controller 100 adds the latency in divided form to the pulse signal. If large latency is generated at once, the duty ratio of the pulse signal changes significantly. By gradually generating the latency in this way, however, the influence on the duty ratio can be reduced.

It is to be appreciated that the Detailed Description section, and not the Summary and Abstract sections (if any), is intended to be used to interpret the claims. The Summary and Abstract sections (if any) may set forth one or more but not all embodiments of the inventive aspects as contemplated by the inventor(s), and thus, are not intended to limit the claimed subject matter in any way.

While the claimed subject matter has been described herein with reference to embodiments in fields and applications, it should be understood that the claimed subject matter is not limited thereto. Other embodiments and modifications thereto are possible, and are within the scope and spirit of the inventive aspects. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the claimed subject matter should not be limited by any of the above-described embodiments, but should be defined only in accordance with the following claims and their equivalents.

What is claimed is:

1. A phase controller comprising:
a plurality of pulse width modulation (PWM) circuits configured to output pulse signals;
a plurality of switching devices, each coupled to a corresponding one of the plurality of PWM circuits, configured to switch on and off based on the pulse signals;
a computing unit configured to calculate a duty ratio of each pulse signal of the plurality of pulse signals to be output from the plurality of PWM circuits, based on outputs of the plurality of switching devices; and
a latency generator configured to calculate a latency for at least one pulse signal of a plurality of pulse signals and provide the latency in one or more delayable units to the at least one pulse signal of the plurality of pulse signals such that no edge positions of the plurality of pulse signals output from the plurality of PWM circuits collide with each other, wherein the plurality of pulse signals change values at the edge positions, wherein the latency generator is configured to generate a table for each of the plurality of pulse signals, and wherein each table is configured to indicate positions of changing state of a corresponding pulse signal.

2. The phase controller of claim 1, wherein the delayable unit is a time width of a minimum resolution of latency adjustment supported by the phase controller.

3. The phase controller of claim 1, wherein the latency generator is configured to shift the positions of changing state of the at least one pulse signal of the plurality of pulse signals when the positions of changing state of the at least one pulse signal collide with at least one other pulse signal of the plurality of pulse signals.

4. The phase controller of claim 1, wherein the latency generator is configured to divide the at least one pulse signal of the plurality of pulse signals to generate the table.

5. The phase controller of claim 1, wherein the latency generator is configured to assigned predetermined lengths to the edge positions in the tables.

6. The phase controller of claim 1, wherein the latency generator further comprises at least one shift register configured to shift the edge positions indicated in the table generated for the at least one pulse signal of the plurality of pulse signals when the edge positions indicated in the table generated for the at least one pulse signal collide with at least one other pulse signal of the plurality of pulse signals.

7. The phase controller of claim 1, wherein edge positions of the at least one pulse signal of the plurality of signals, have at least one predetermined length in the corresponding table.

8. The phase controller of claim 7, wherein an on edge position of the edge positions has a first length and an off edge position of the edge positions has a second length.

9. The phase controller of claim 1, wherein the latency generator is further configured to divide the latency into a plurality of portions and provide the latency as the plurality of portions to the at least one pulse signal over a plurality of periods, wherein each portion of the plurality of portions includes one or more delayable units.

10. The phase controller of claim 9, wherein the latency generator is configured to provide the latency as the plurality of portions to the at least one pulse signal in alternate periods of the at least one pulse signal.

11. A light modulation system comprising:
a plurality of light emitting diodes (LEDs);
a plurality of pulse width modulation (PWM) circuits configured to output pulse signals;
a plurality of drivers, each driver coupled to a corresponding PWM circuit of the plurality of PWM circuits and coupled to a corresponding LED of the plurality of LEDs, each driver, of the plurality of drivers, configured to switch the corresponding LED on and off based on a pulse signal;
a computing unit configured to calculate a duty ratio of each pulse signal of the plurality of pulse signals to be output from the plurality of PWM circuits, based on outputs of the plurality of drivers; and
a latency generator configured to calculate a latency for at least one pulse signal of a plurality of pulse signals and provide the latency in one or more delayable units to the at least one pulse signal of the plurality of pulse signals such that that edge positions of the plurality of pulse signals output from the plurality of PWM circuits do not collide with each other, wherein the plurality of pulse signals change values at the edge positions, wherein the latency generator is configured to generate a table for each of the plurality of pulse signals, wherein each table is configured to indicate positions of changing state of a corresponding pulse signal, and wherein the latency generator is further configured to calculate the latency for the at least one pulse signal based on the data indicating the edge positions of the plurality of pulse signals.

12. The light modulation system of claim 11, wherein the latency generator comprises:
- a table generator configured to generate tables for the pulse signals calculated by the computing unit, the tables including information to distinguish the edge positions; and
- a latency calculator configured to calculate the latency which does not cause collision of the edge positions of the plurality of pulse signals, based on the tables.

13. The light modulation system of claim 12, wherein the latency generator further comprises at least one shift register configured to shift the edge positions indicated in the table generated for the at least one pulse signal of the plurality of pulse signals when the edge positions indicated in the table generated for the at least one pulse signal collide with at least one other pulse signal of the plurality of pulse signals.

14. The light modulation system of claim 12, wherein predetermined lengths are assigned to the respective edge positions in the tables.

15. The light modulation system of claim 14, wherein different lengths are assigned to an on edge position and an off edge position of the edge positions.

16. The light modulation system of claim 11, wherein the latency generator is further configured to divide the latency into a plurality of portions and provide the latency as the plurality of portions to the at least one pulse signal over a plurality of periods, wherein each portion of the plurality of portions includes one or more delayable units.

17. The light modulation system of claim 16, wherein the latency generator is configured to provide the latency as the plurality of portions to the at least one pulse signal in alternate periods of the at least one pulse signal.

* * * * *